(12) United States Patent
Kapinos et al.

(10) Patent No.: US 10,877,518 B2
(45) Date of Patent: Dec. 29, 2020

(54) DOCKING COMPONENT

(71) Applicant: Lenovo (Singapore) Pte. Ltd., Singapore (SG)

(72) Inventors: Robert James Kapinos, Durham, NC (US); Scott Wentao Li, Cary, NC (US); Robert James Norton, Jr., Raleigh, NC (US); Russell Speight VanBlon, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 149 days.

(21) Appl. No.: 15/940,332

(22) Filed: Mar. 29, 2018

(65) Prior Publication Data

US 2019/0302844 A1 Oct. 3, 2019

(51) Int. Cl.
| | |
|---|---|
| G06F 1/16 | (2006.01) |
| H05K 5/00 | (2006.01) |
| H05K 7/00 | (2006.01) |
| H05K 7/14 | (2006.01) |
| H02J 7/00 | (2006.01) |
| G06F 1/26 | (2006.01) |
| H01Q 1/22 | (2006.01) |

(52) U.S. Cl.
CPC .......... *G06F 1/1632* (2013.01); *G06F 1/1679* (2013.01); *G06F 1/263* (2013.01); *H02J 7/0042* (2013.01); *H05K 7/1427* (2013.01); *G06F 1/1662* (2013.01); *H01Q 1/22* (2013.01); *H02J 2007/0062* (2013.01)

(58) Field of Classification Search
CPC .... G06F 1/1632; G06F 1/1679; G06F 1/1633; G06F 1/1675; G06F 1/1613

USPC .......... 361/679.43, 679.41–679.45, 679.01, 361/679.02
See application file for complete search history.

(56) References Cited

U.S. PATENT DOCUMENTS

| | | | | |
|---|---|---|---|---|
| 7,978,466 | B2 * | 7/2011 | Lewandowski ....... | G06F 1/1632 361/679.41 |
| 8,649,169 | B2 * | 2/2014 | Kwon ..................... | G06F 21/88 361/679.41 |
| 10,084,273 | B2 * | 9/2018 | Netsu ................... | H01R 13/447 |
| 2002/0159231 | A1 * | 10/2002 | Nguyen ............... | G06F 1/1632 361/679.27 |
| 2008/0296449 | A1 * | 12/2008 | Carnevali .............. | B60R 11/02 248/205.1 |
| 2012/0206875 | A1 * | 8/2012 | Carnevali ............. | G06F 1/1632 361/679.41 |
| 2013/0107446 | A1 * | 5/2013 | Carnevali ............. | G06F 1/1632 361/679.43 |
| 2013/0223003 | A1 * | 8/2013 | Carnevali ............. | G06F 1/1626 361/679.43 |

* cited by examiner

*Primary Examiner* — Anthony M Haughton
(74) *Attorney, Agent, or Firm* — Brian J. Pangrle (57) ABSTRACT

A docking component can include a cross-member that includes a first end, an opposing second end, circuitry and at least one port operatively coupled to the circuitry; a first end wall at the first end of the cross-member; a second end wall at the second end of the cross-member, where the second end wall includes at least one connector that is operatively coupled to the circuitry; and a translation mechanism that translates the at least one connector from an unlocked state to a locked state that engages the at least one connector and a corresponding at least one connector of an information handling device.

15 Claims, 8 Drawing Sheets

| | | | | | | | | | | |
|---|---|---|---|---|---|---|---|---|---|---|
| GND | TX | TX | V | CC | D | D | SBU | V | RX | RX | GND |
| GND | RX | RX | V | SBU | D | D | CC | V | TX | TX | GND |

TX USB DP     USB 2.0     RX USB TX DP

GND    Power (2nd Bus)    Vconn USB-PD

220

| Type-C/PD Function | MCU | Power | Data/Video | Power Architecture | Protection |

DOCKING COMPONENT

TECHNICAL FIELD

Subject matter disclosed herein generally relates to docking components and systems.

BACKGROUND

An information handling device may include various ports. Where such a device has a form factor such as that of a notebook computer, etc., space may be limited for ports. As an example, a docking component (e.g., a docking station) may, for example, extend ports (e.g., a docking component may be a port replicator).

SUMMARY

A docking component can include a cross-member that includes a first end, an opposing second end, circuitry and at least one port operatively coupled to the circuitry; a first end wall at the first end of the cross-member; a second end wall at the second end of the cross-member, where the second end wall includes at least one connector that is operatively coupled to the circuitry; and a translation mechanism that translates the at least one connector from an unlocked state to a locked state that engages the at least one connector and a corresponding at least one connector of an information handling device. Various other methods, apparatuses, systems, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing general principles of various implementations. The scope of invention should be ascertained with reference to issued claims.

Figure 1:
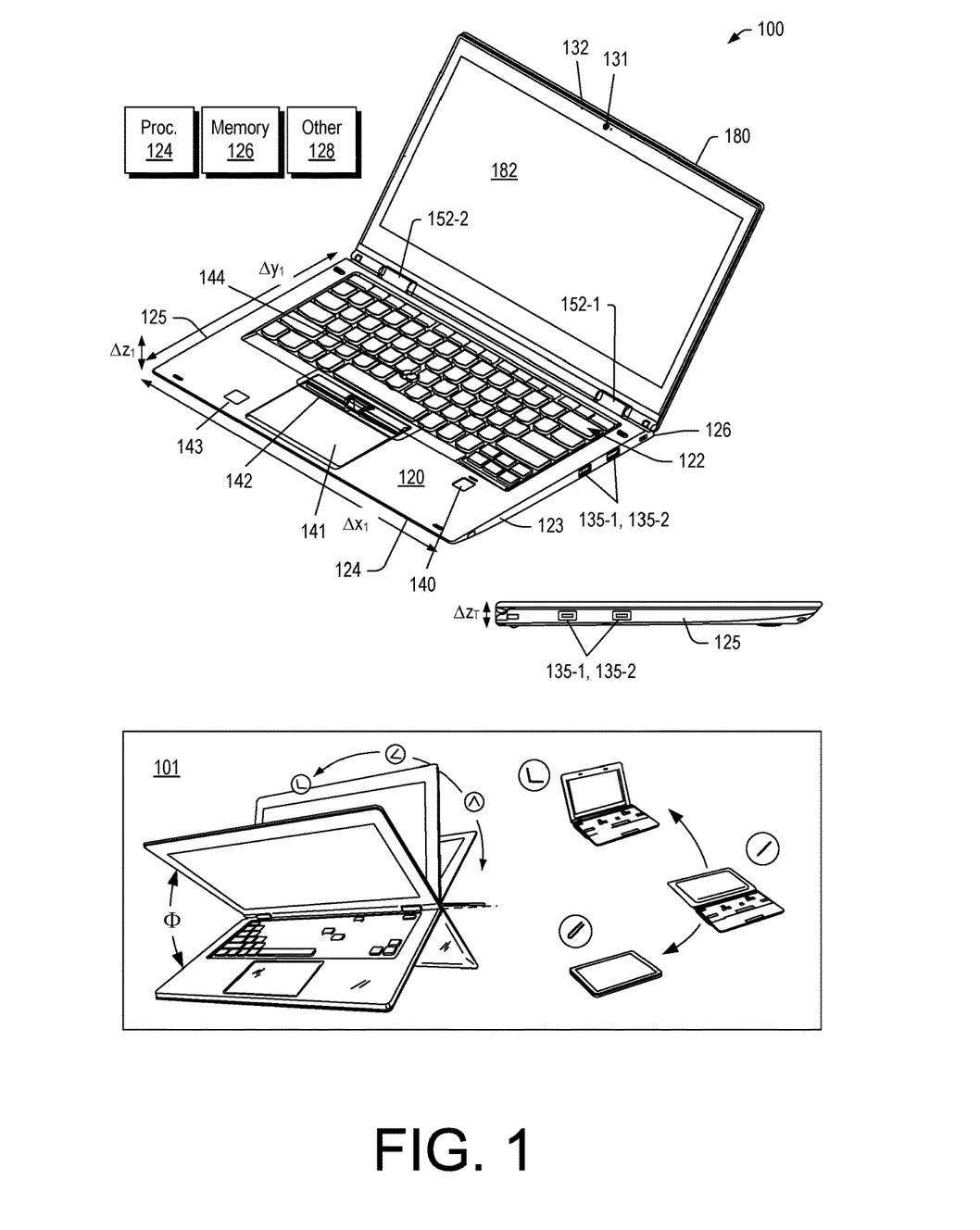
FIG. 1 is a diagram of an example of a device.

FIG. 1 shows an example of an information handling device 100 that includes a keyboard housing 120 with a keyboard 122 and a display housing 180 with a display 182 that are pivotably coupled, for example, to adjust the angle between the keyboard housing 120 and the display housing 180 about a pivot axis.

As an example, various features of the information handling device 100 (e.g., the device 100) may be referenced with respect to one or more three dimensional coordinate system such as, for example, one or more Cartesian coordinate system with x, y and z coordinate axes. For example, the keyboard housing 120 may be defined with respect to $x_1$, $y_1$ and $z_1$ coordinate axes while the display housing 180 may be defined with respect to $x_2$, $y_2$ and $z_2$ coordinate axes. In such an example, an angle $\Phi$ may be defined between a plane defined by the keyboard 122 and a plane defined by the display 182.

In the example of FIG. 1, dimensions $\Delta x_i$ and $\Delta y_i$ illustrated a width (widthwise) dimension and a depth (depthwise) dimension, respectively. A footprint of the keyboard housing 120 may be defined by such dimensions (e.g., a widthwise dimension to accommodate fingers of hands for touch typing and a depthwise dimension to accommodate rows of keys). As shown in FIG. 1, the keyboard housing 120 includes a right hand side 123, a front edge 124, a left hand side 125 and a back edge 126. While sides, edges and dimensions are defined and shown for the keyboard housing 120, similar sides, edges and dimensions may be defined as shown for the display housing 180.

Various examples of orientations 101 are illustrated in FIG. 1. Such orientations include a closed orientation (e.g., where $\Phi$ is 0 degrees), a laptop orientation (e.g., where $\Phi$ is greater than zero degrees and less than 180 degrees), a flat orientation (e.g., where $\Phi$ is 180 degrees), and a tablet orientation (e.g., where $\Phi$ is 360 degrees), as well as one or more intermediate orientations (e.g., consider a tent orientation where $\Phi$ is greater than 180 degrees and less than 360 degrees).

As an example, the keyboard housing 120 can be of a height that is a fraction of a total height of the device 100 in a closed clamshell orientation or in a tablet orientation. For example, a dimension $\Delta z_1$ is shown along with $\Delta z_T$ where $\Delta z_1$ is a fraction of the total height $\Delta z_T$. As shown, the height of the display housing 180 is less than the height of the keyboard housing 120. As an example, a device may include housings of approximately similar heights (e.g., thicknesses) or may include a display housing that is thicker than a keyboard housing.

As an example, the device 100 can include a processor 124, memory 126 and other circuitry 128. As an example, the memory 126 may store instructions executable by the processor 124. For example, operating system instructions may be stored in the memory 126 and executable by the processor 124 to establish an operating system environment that can be implemented to execute applications, control circuitry, receive information, transmit information, etc.

As shown in the example of FIG. 1, the device 100 can include a camera 131, a microphone 132, ports 135-1 and 135-2, a fingerprint reader 140, a trackpad 141, trackpad control buttons 142, a NFC indicator 143, a pointing stick 144, and various other features.

As shown in the example of FIG. 1, the device 100 includes one or more hinges 152-1 and 152-2, which provide for transitioning the device 100 to and/or from one or more of the orientations 101. The one or more hinges 152-1 and 152-2 can include friction components (e.g., friction hinge(s)), gears, axles, etc. The one or more hinges 152-1 and 152-2 operatively coupled the housings 120 and 180. As an example, one or more wires or other electrical connections may be made between the housings 120 and 180, optionally via one or more hinge features (e.g., a hinge electrical connector, a hinge pass through for a wire, etc.). As an example, the processor 124 may be disposed in the keyboard housing 120 and circuitry may operatively couple the processor 124 to the display 182 such that information may rendered to the display 182 at least in part via operation of the processor 124. As an example, the device 100 can include a motherboard that includes various components such as one or more processors.

As to the ports 135-1 and 135-2, these may be located on the right hand side 123 and/or the left hand side 125 of the keyboard housing 120 of the device 100. For example, the device 100 may include port symmetry or port asymmetry. As to port symmetry, consider one or more ports on the left hand side 125 and one or more ports on the right hand side 123 of the device 100 where the ports may be at the same set of y-coordinates (e.g., depthwise dimensions). As to port asymmetry, consider an example where one side includes one or more ports while the other side may include no ports or a different number and/or position(s) of one or more ports. In such an example, where the other side includes one or more ports, one or more of those may or may not be at the same y-coordinate(s) as the ports on the opposing side thereby making the left hand side and right hand side asymmetric. Various examples of ports are explained further below with respect to various examples of docking components. As an example, the device 100 can include one or more types of circuitry that can operatively couple with a docking component, which may be via one or more connectors, which may be one or more port connectors.

As an example, the one or more ports 135-1 and 135-2, whether on the right hand side 123 and/or the left hand side 125, may include one or more features of the Type-C USB port. A table, Table 1, below includes various information associated with the Type-C port specification.

and α11 to A10 and A11. In such an arrangement reversibility means that a connector can be in one of two orientations (e.g., 180 degrees apart) and effectively connect. As an example, a user may plug a male connector into a female port and then may unplug the male connector, rotate it by 180 degrees (e.g., a second, different orientation) and plug it into the female port and achieve the same result in either orientation.

As an example, a cable, a computing device and/or a docking component may allow for mixed types of connectors (e.g., interfaces). For example, a USB Type-C to USB Micro-B cable (e.g., or device) may allow for connecting a USB Type-C port with a USB Micro-B port (e.g., consider a camera, a smartphone, a tablet, etc. that includes one of those USB port types).

Some examples of types of ports include, PS/2, DB-25, DE-9, RS-232, COM, audio (e.g., 3.5 mm TRS, S/PDIF/TOSLINK, etc.), video (e.g., VGA, DVI, Mini-DVI, Micro-DVI, Display Port, RCA, component video, S-Video, HDMI, etc.), USB (e.g., USB Type A, USB Type C, etc.), RJ-45, RJ-11, e-SATA, etc.

Figure 2:
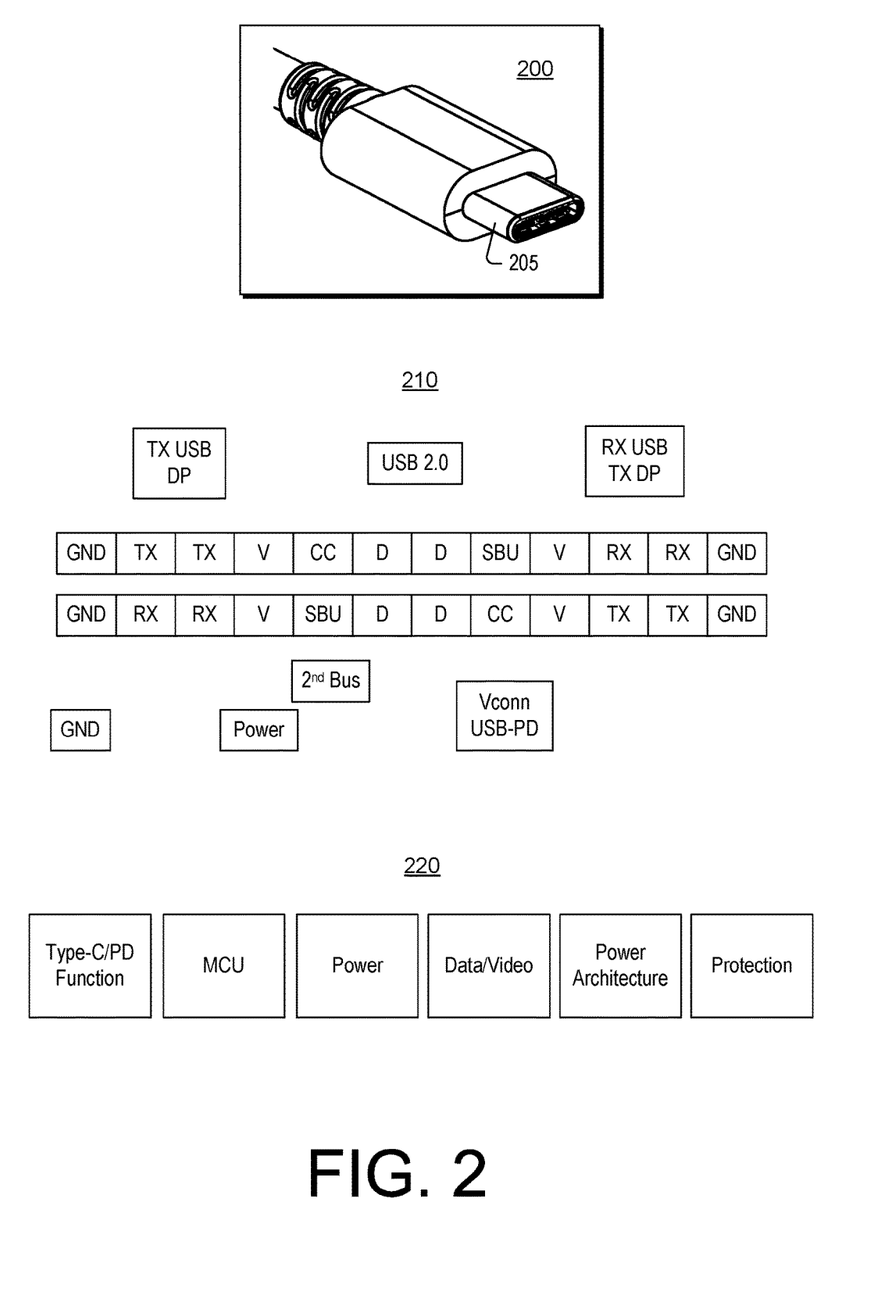
FIG. 2 is a diagram of an example of a plug and connector specification.

FIG. 2 shows an example of a cable 200, a pin configuration 210 and various functions 220 that may be implemented using the pin configuration 210.

The cable 200 is shown as a USB Type-C cable with a male connector 205. The male connector 205 can be dimensioned approximately 0.3 inch (~0.12 cm) by approximately 0.1 inch (~0.4 cm). As an example, a connector may be a Micro-B connector with dimensions of approximately 0.28 inch by 0.06 inch (~0.11 cm by ~0.24 cm). The USB Type-C is reversible, meaning that it can be plugged in upside down and work (e.g., two orientations 180 degrees apart). Spe-

TABLE 1

USB-C (Type-C) Port and Pinouts

| Pin | Name | Description | Pin | Name | Description |
|---|---|---|---|---|---|
| A1 | GND | Ground return | B12 | GND | Ground return |
| A2 | SSTXp1 | SuperSpeed differential pair #1, TX, positive | B11 | SSRXp1 | SuperSpeed differential pair #2, RX, positive |
| A3 | SSTXn1 | SuperSpeed differential pair #1, TX, negative | B10 | SSRXn1 | SuperSpeed differential pair #2, RX, negative |
| A4 | $V_{BUS}$ | Bus power | B9 | $V_{BUS}$ | Bus power |
| A5 | CC1 | Configuration channel | B8 | SBU2 | Sideband use (SBU) |
| A6 | Dp1 | Non-SuperSpeed differential pair, position 1, positive | B7 | Dn2 | Non-SuperSpeed differential pair, position 2, negative |
| A7 | Dn1 | Non-SuperSpeed differential pair, position 1, negative | B6 | Dp2 | Non-SuperSpeed differential pair, position 2, positive |
| A8 | SBU1 | Sideband use (SBU) | B5 | CC2 | Configuration channel |
| A9 | $V_{BUS}$ | Bus power | B4 | $V_{BUS}$ | Bus power |
| A10 | SSRXn2 | SuperSpeed differential pair #4, RX, negative | B3 | SSTXn2 | SuperSpeed differential pair #3, TX, negative |
| A11 | SSRXp2 | SuperSpeed differential pair #4, RX, positive | B2 | SSTXp2 | SuperSpeed differential pair #3, TX, positive |
| A12 | GND | Ground return | B1 | GND | Ground return |

As an example, a port may be a USB Type-C specification port. Such a port may utilize a reversible-plug connector. As an example, a port may be a LIGHTNING® specification port or a THUNDERBOLT® specification port.

As to the USB Type-C specification port, a connector can include 24-pins in a double-sided arrangement that can provide four power-ground pairs, two differential pairs for USB 2.0 data bus, four pairs for SuperSpeed data bus, two "sideband use" pins, $V_{CONN}$+5 V power for active cables, and a configuration pin for cable orientation detection and dedicated biphase mark code (BMC) configuration data channel. As shown in Table 1, symmetry can exist for the pins, for example, compare B2 and α3 to A2 and A3 or B10 cifically, the male connector 205 can be inserted into a Type-C USB port in one of two orientations due to symmetry of the male connector and the female connector (e.g., the port) according to specifications of the Type-C USB.

As to the functions 220, these can include Type-C and/or power delivery (PD) function, microcontroller (MCU), power, data that can include video, power architecture and protection (e.g., security).

Figure 3:
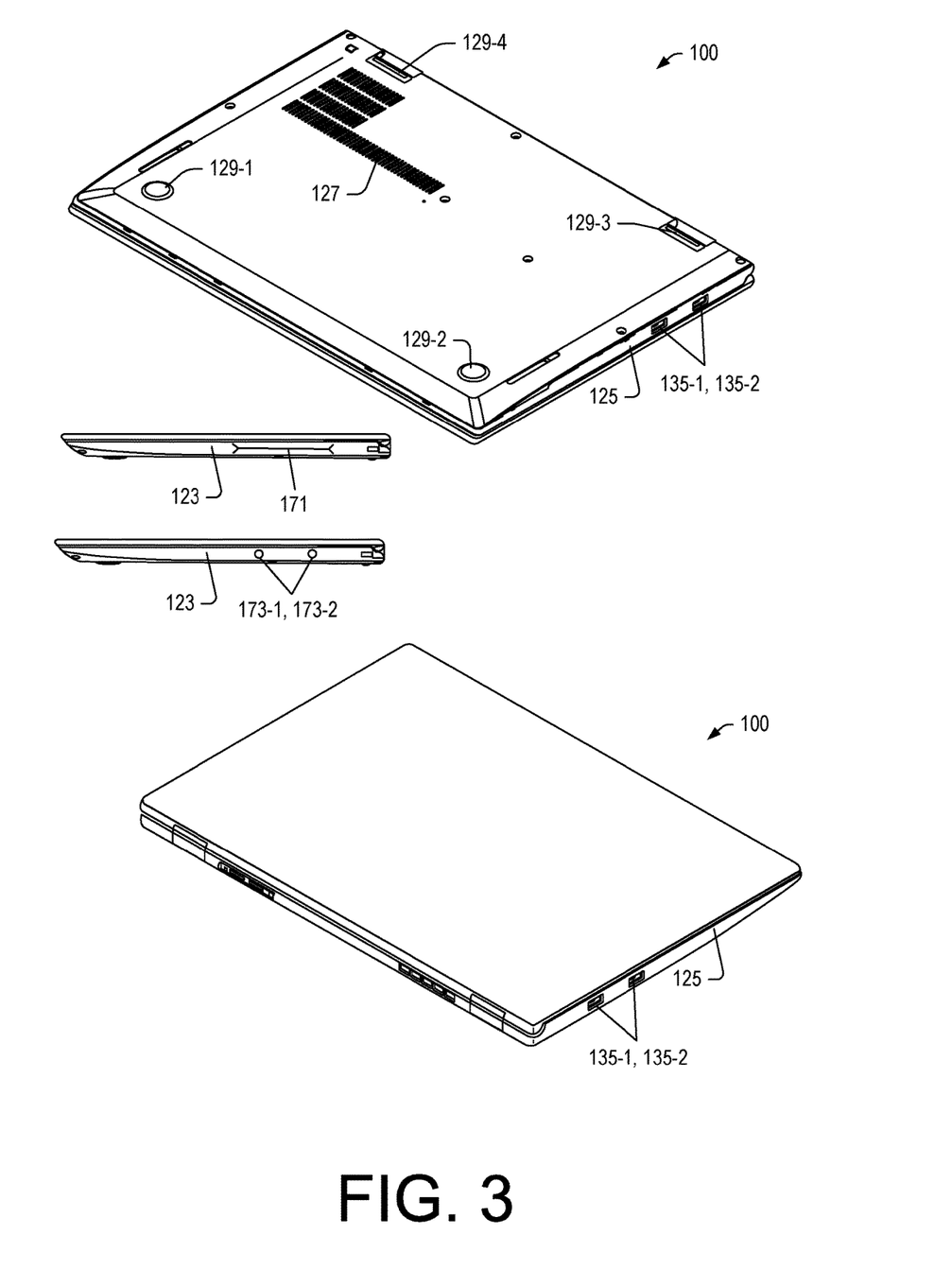
FIG. 3 is a diagram of a bottom view and a top view of the device of FIG. 1.

FIG. 3 shows a bottom side view of the device 100 and a top side view of the device 100 where the device 100 is in a closed orientation (e.g., a closed clamshell orientation). As shown, in a closed orientation keys of a keyboard of a keyboard housing can face a display portion of a display of a display housing. In the closed orientation, the keys are not accessible for touching by a user and the display is not available for viewing by a user. In the example of FIG. 3, the device 100 includes the one or more ports 135-1 and 135-2 on a left hand side 125 of the device 100, as the device 100 would be oriented before a user in a laptop orientation of the device 100 (e.g., where the device 100 is open at an angle between approximately 30 degrees to approximately 180 degrees). As mentioned, a device can include one or more ports on one or more sides (e.g., left hand side and/or right hand side).

In FIG. 3, the device 100 is shown as including various vents 127, which can be airflow vents for purposes of heat transfer from the device 100 to the environment. In FIG. 3, the device 100 is shown as including feet 129-1, 129-2, 129-3 and 129-4, which may include, for example, one or more resilient feet that can function to reduce slippage (e.g., increase friction coefficient) between the device 100 and a surface such as a surface of a table or a desk.

As mentioned, a docking component may be utilized with a device such as the device 100. A docking component may be referred to as a docking station. A docking component can include various features including, for example, port replication features. As mentioned with respect to FIG. 1, the device 100 can be oriented in various orientations that can range from approximately 0 degrees to approximately 360 degrees (see, e.g., the angle Φ). As an example, a docking component may be configured with various features to physically couple to the device 100.

A docking component can include circuitry, which may include integrated circuits (ICs), wires, printed circuits, etc. As an example, a battery can be a type of circuitry. As an example, circuitry can operatively couple a connector of a docking component to one or more ports. As an example, consider a power port that can receive a connector that can provide power (e.g., a power cord connector, an AC adapter connector, etc.). Such power may be provided to power circuitry of the docking component, which may be, for example, associated with one or more batteries (e.g., one or more rechargeable batteries). As an example, power provided at the power port may directly or indirectly (e.g., via a battery) be provided at a connector of the docking component. For example, consider a USB connector that can transmit power. In such an example, power of the docking component may be transmitted to a device such as the device 100.

As an example, a docking component may include memory as a type of circuitry. As an example, a docking component may include an antenna as a type of circuitry. As an example, a docking component may include a SIM card for cellular network service as a type of circuitry. As an example, a docking component may include one or more multiplexers as types of circuitry. As an example, a docking component may include one or more types of converters as types of circuitry (e.g., consider a converter that can convert a signal of one type into a signal of another type). A docking component may provide one or more features that can be utilized in conjunction with one or more features of a device such as the device 100. One or more of such features may be utilized where the docking component is physically coupled to the device, which may be via a connector-to-connector coupling (e.g., mating of a male connector and a female connector, etc.).

As shown in FIG. 3, the right hand side 123 of the device 100 can include features 171 and/or 173-1 and 173-2 that can cooperate with features of a docking component. The feature 171 may be a substantially linear feature such as a groove that can seat a feature of a docking component and the features 173-1 and 173-2 may be openings of one or more types of cross-sectional profiles that can seat one or more respective features of a docking component. In such examples, one or more features on a side of a device (e.g., a keyboard housing of a device) can be utilized to help secure a docking component in a locked state with respect to the device. As an example, one or more features may be anti-rotation features such that rotation of a docking component with respect to a device is limited (e.g., to limit rocking, etc.).

In a locked state, the device and the docking component can be a unitary system or assembly where the system may be transported, carried, etc., with minimal risk of the docking component becoming inadvertently uncoupled from the device. For example, a user may insert such a system into a bag such as a handbag, a backpack, a shoulder bag, etc., where the system retains a relatively slim profile and where, during movement, the system remains in the locked state.

As an example, a feature of a keyboard housing that helps to secure a docking component in a locked state may be or include a magnetic material (e.g., a ferromagnetic material) such that a magnetic attraction force may help to secure the docking component to the keyboard housing in the locked state. For example, one or more of the features 171, 173-1 and 173-2 may be proximate to a magnetic material where a docking component also includes a magnetic material where a magnetic attraction force can be established therebetween.

Figure 4:
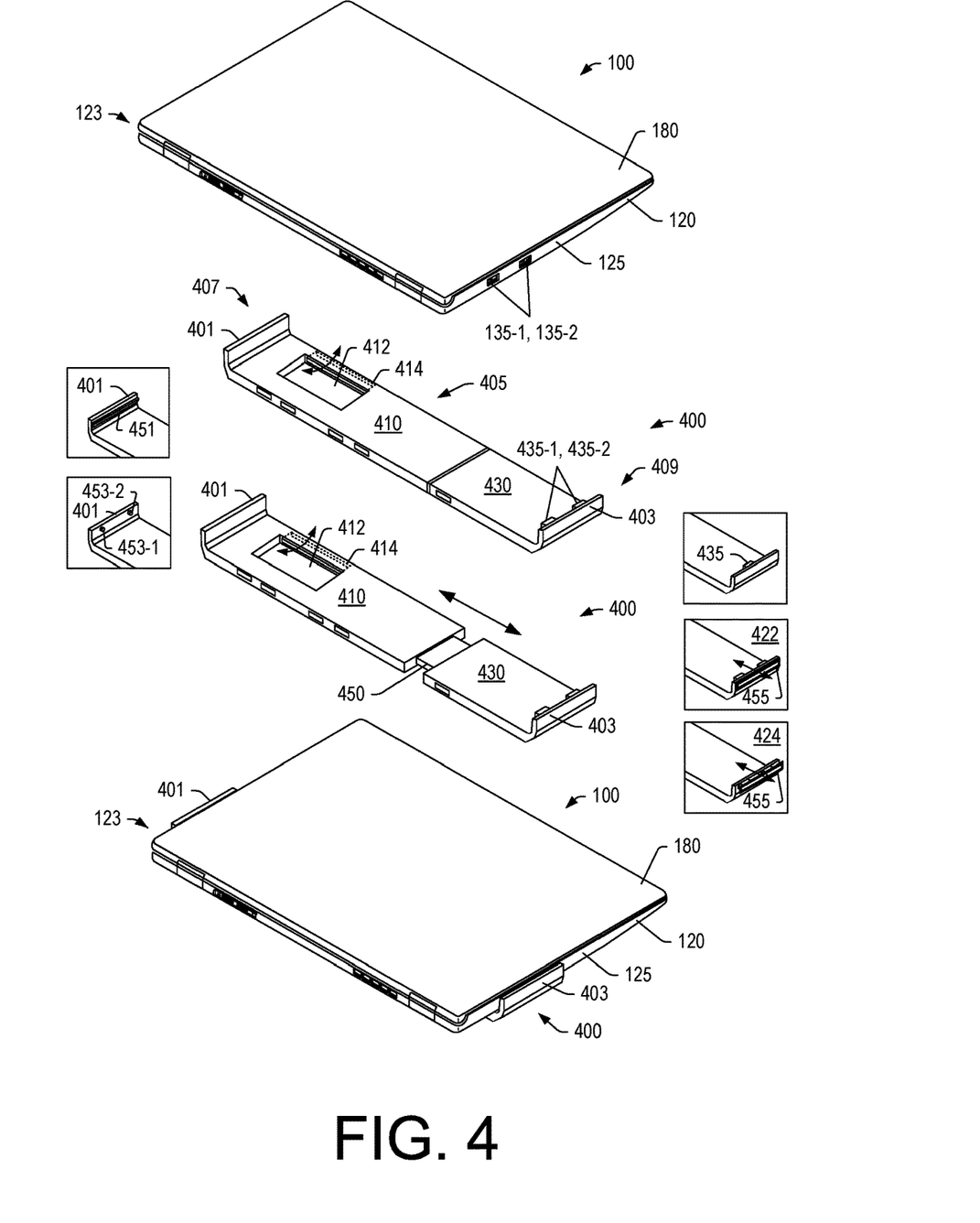
FIG. 4 is a diagram of an example of a system.

FIG. 4 shows an example of a docking component 400 that includes opposing ends 401 and 403 that can be positioned on the right hand side 123 or the left hand side 125 and the left hand side 125 or the right hand side 123, respectively, of the device 100. In the example of FIG. 4, the end 403 is shown as being a left hand side while the end 401 is shown as being a right hand side. In the example of FIG. 4, the docking component 400 includes portions 410 and 430 that can be translated away and toward each other, for example, via a translation mechanism 450, which may include one or more rails, one or more springs, one or more magnets, one or more latches, etc.

More particularly, in the example of FIG. 4, the docking component 400 includes a cross-member 405, a first end wall 407 at the end 401 and a second end wall 409 at the end 403.

The docking component 400 also includes one or more connectors 435, 435-1 and 435-2 that can be received by one or more of the one or more ports 135-1 and 135-2. In the example of FIG. 4, the one or more connectors 435, 435-1 and 435-2 may be male connectors as shown with respect to the plug 200 of FIG. 2 while the one or more ports 135-1 and 135-2 may be female connectors where each of the female connectors can receive a respective male connector to establish electrical connections (e.g., contact of electrically conductive materials) therebetween.

As an example, a male-to-male connector may be utilized as a component that can connect two female connectors (e.g., a female connector of a device and a female connector of a docking component). As an example, a device may include a male connector and a docking component may include a female connector where the male connector can connect to the female connector.

As an example, a method can include translating portions of a docking component away from one another to orient the docking component in an unlocked state, positioning the docking component in the open state with respect to a device, and then translating the portions of the docking component toward one another to orient the docking component in a locked state. In such an example, male and female connectors may be aligned such that upon transitioning the docking component from the unlocked state to the locked state, the male and female connectors mate to establish electrical contact (e.g., and/or optical) therebetween. Such a method can further include transmitting information and/or power from the docking component to the device and/or from the device to the docking component.

As mentioned with respect to FIG. 3, a side of a keyboard housing of a device can include one or more features that help to secure a docking component. As shown in FIG. 4, the docking component 400 can include a substantially linear protrusion 451 that may be received by the substantially linear feature 171 (e.g., a groove) and/or the docking component 400 can include one or more other types of protrusions 453-1 and 453-2, which may be of a length and cross-sectional shape and size to be received by one or more of the features 173-1 and 173-2. As an example, one or more of the features 173-1 and 173-2 can be shaped as a cylindrical opening and the one or more protrusions 453-1 and 453-2 can be shaped as a cylindrical pin that can be received by a cylindrical opening, optionally with an interference fit (e.g., a press-fit). As an example, one or more features may be made of a resilient material (e.g., a polymeric material such as, for example, a natural and/or a synthetic rubber). As an example, at least a portion of the docking component may be made of a polymeric material, which may be resilient. For example, the cross-member 405, the end wall 407 and/or the end wall 409 may be made at least in part of a polymeric material that may be resilient. Such material may provide for a snug fit to the keyboard housing 120 where an impact to the docking component 400 (e.g., contacting a desk surface or other surface) can be absorbed at least in part by the resilient material. As mentioned, a feature or features may help to limit anti-rotation of a docking component with respect to a device when coupled together. Anti-rotation may help to limit rocking and may help to secure the docking component to the device, for example, for purposes of transport, etc.

As an example, the docking component 400 may be manufactured to be relatively light in mass such that it does not add significantly to the mass of a device to which it is coupled in a locked state. For example, the docking component 400 may be of a mass less than approximately 454 grams. Where the docking component 400 is made at least in part of a resilient material and where the mass is less than approximately 454 grams, the docking component 400 may provide a balance as to momentum and protection where an increase in momentum due to mass of the docking component 400 may be balanced by an ability of the docking component 400 to absorb shock. As an example, the docking component 400 may be a bumper in that it can absorb shock such that contact of the bumper by a surface protects the device 100 from at least a portion of the energy of that contact. For example, consider a user that may drop or throw down the device 100 onto a table or a desk where the docking component 400 makes contact with the table or the desk and absorbs shock to help protect the device 100 from the energy of contact.

Figure 7:
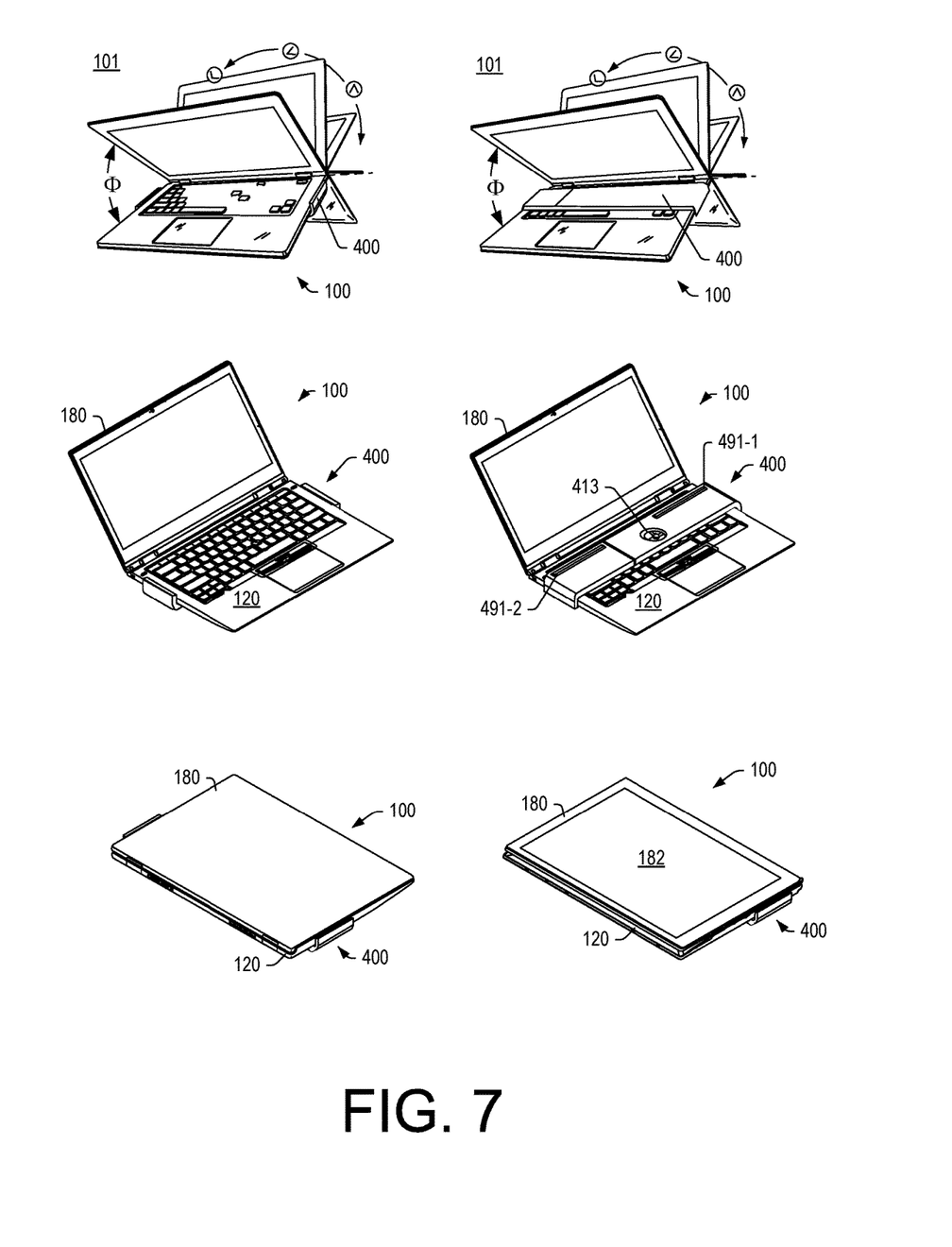
FIG. 7 is a series of diagrams of examples of a system in different orientations.

As an example, the docking component 400 may include one or more feet (see, e.g., one or more feet 491-1 and 491-2 of FIG. 7). In such an example, at least one of the one or more feet may be made of a resilient material that is capable of absorbing shock and/or increasing a friction coefficient with respect to a surface such as a surface of a table or a desk. As to increasing friction coefficient, such an approach may substitute for one or more feet of a keyboard housing (see, e.g., the one or more feet 129-1, 129-2, 129-3 and 129-4 in FIG. 3) that may not be in contact with a surface due to the presence of the cross-member 405 of the docking component 400.

As an example, one or more sides of a docking component may include one or more passages such as, for example, one or more openings for purposes of accessing a port, passing air, etc. In FIG. 4, one or more passages 412 and 414 are shown in the cross-member 405, which may be one or more airflow passages. For example, the passage 412 may at least in part overlap with the one or more vents 127 of the keyboard housing 120 as illustrated in FIG. 3 where the passage 412 may open below (e.g., optionally an elevated opening due to one or more feet of the docking component 400) and/or may open to a side or sides of the cross-member 405.

As an example, referring to the device 100 of FIG. 1, an opening or other cut-out (e.g., notch) in a cross-member of a docking component may provide access to a feature of the keyboard housing 120, which may be a key or keys or, for example, the pointing stick 144 or other type of operational tool of the device 100. In such an example, with the cross-member covering a portion of the keyboard 122, the tool (e.g., the pointing stick 144) may be accessible, for example, for navigation of information rendered to the display 182 of the display housing 180. In such an example, consider a passage in the cross-member that can coincide with the tool (e.g., the pointing stick 144). In a tablet or tent orientation, a user may utilize the tool with a finger while, for example, viewing the display 182. As an example, a docking component may mount to a keyboard housing in a manner whereby covers a portion of a keyboard but does not cover a particular feature (e.g., component) of a keyboard such as, for example, the pointing stick 144 (see, e.g., the passage or opening 413 in FIG. 7).

As an example, a portion of a docking component can be a male connector portion that translates male connectors into and output of female connectors. For example, alternatively or additionally, the docking component 400 may include one or more translation mechanisms that can translate one or more of the one or more connectors 435, 435-1 and 435-2. For example, a push button mechanism may be accessible via the end 403 (e.g., top or a side or sides) that includes one or more push buttons that can be actuated via a hand of a user to cause one or more of the one or more connectors 435, 435-1 and 435-2 to translate inwardly or outwardly (e.g., with respect to the opposing side 401).

In the example of FIG. 4, a translation mechanism 455 with a push button configuration of the docking component 400 is illustrated in a locked state 422 and in an unlocked state 424. In such an example, a single button or more than one button may be utilized to translate one or more of the one or more connectors 435-1 and 435-2. Such a configuration may be spring-loaded. As an example, a push button and release configuration may be utilized where, for example, a push button can be pushed to translate one or more of the one or more connectors 435-1 and 435-2 to compress a biasing mechanism (e.g., a spring, etc.) where a latch may lock one or more of the one or more connectors 435-1 and 435-2 in a locked state. A release button or buttons may be actuated by a hand or hands of a user to release the latch where the biasing mechanism causes one or more of the one or more connectors 435-1 and 435-2 to translate outward, for example, out of a respective connector (e.g., a female connector of the device 100 such as one of the one or more ports 135-1 and 135-2).

In the example of FIG. 4, the docking component 400 is shown as being seated underneath the keyboard housing 120 of the device 100. In the example shown, the display housing 180 may be opened and rotated away from the keyboard housing 120 where the docking component 400 does not interfere with access to keys of a keyboard of the keyboard housing 120.

Figure 5:
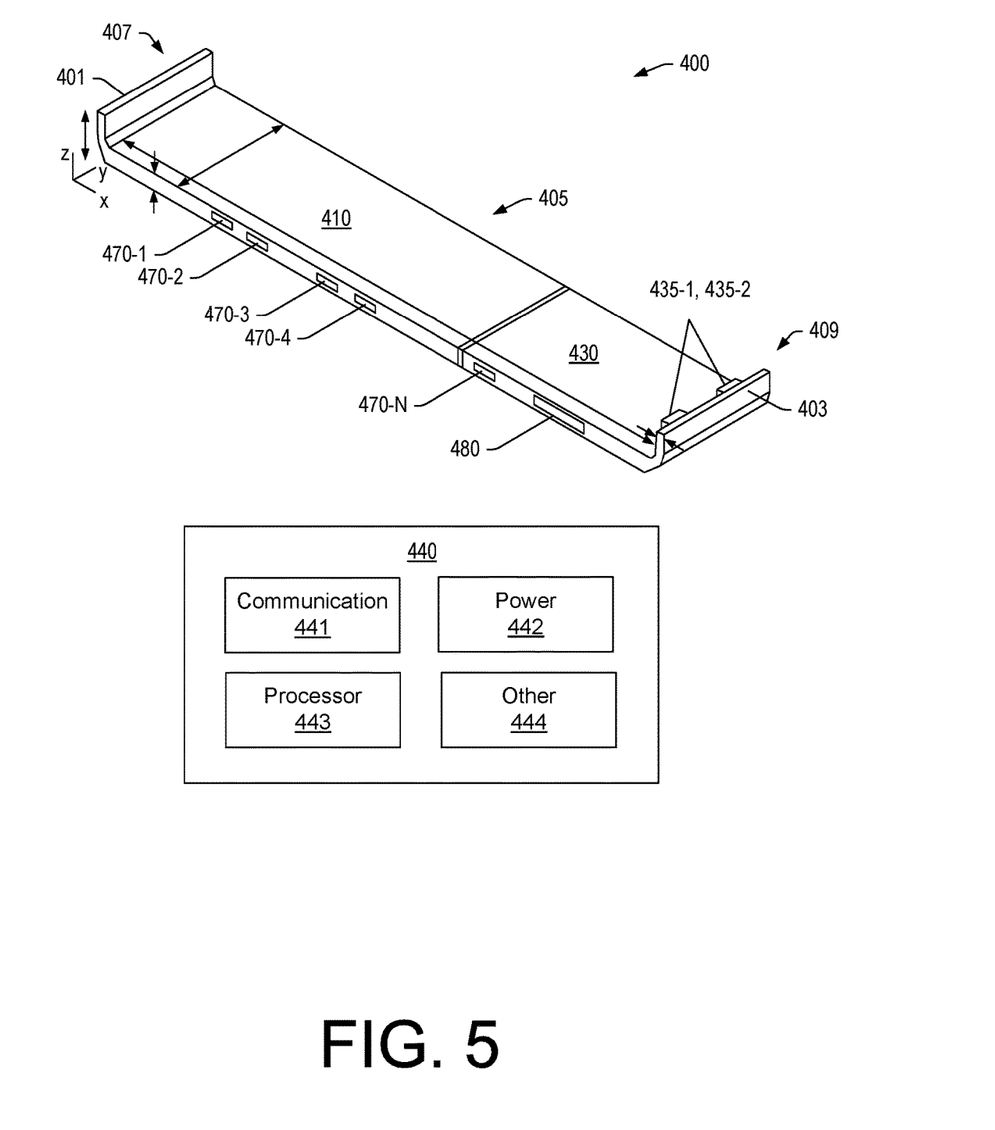
FIG. 5 is a diagram of an example of a docking component.

FIG. 5 shows an example of the docking component 400 along with various arrows that indicate various dimensions of the docking component 400. As an example, one or more features of the docking component 400 may be defined with respect to one or more of the dimensions illustrated, which may be defined with respect to one or more dimensions of a device such as the device 100 of FIG. 1. FIG. 5 shows an example of a Cartesian coordinate system with x, y and z axes. Such a coordinate system may be referenced in defining one or more features of the docking component 400, for example, with respect to one or more features of a device, which may be defined in part with respect to one or more coordinate systems (e.g., $x_1$, $y_1$, $z_1$ and $x_2$, $y_2$, $z_2$ as mentioned with respect to the device 100 of FIG. 1). As an example, the x-axis can correspond to a widthwise dimension, the y-axis can correspond to a depthwise dimension and the z-axis can correspond to a heightwise or thickness dimension where the thickness or height of the end walls 407 and 409 may be greater than the thickness or height of the cross-member 405.

In the example of FIG. 5, the docking component 400 includes the cross-member 405 that includes a first end, an opposing second end and a plurality of ports (see, e.g., ports 470-1 to 470-N and 480, where N is an integer greater than or equal to two); a first end wall 407 at the first end of the cross-member 405; a second end wall 409 at the second end of the cross-member 405, where the second end wall 409 includes at least one connector (see, e.g., the one or more connectors 435-1 and 435-2) that are operatively coupled to one or more of the plurality of ports (e.g., via circuitry, etc.); and a translation mechanism (see, e.g., the translation mechanism 450 and/or 455) that translates the at least one connector from an unlocked state to a locked state for engagement of the at least one connector and a corresponding number of one or more connectors of an information handling device.

In the example of FIG. 5, various ports 470-1 to 470-N and 480 are illustrated. As an example, the port 480 may be a media port, for example, to accept a memory card (e.g., an SD card, etc.) that can be operatively coupled via one or more of the connectors 435-1 and 435-2 to a device. The ports 470-1 to 470-N may include one or more replica ports that replicate one or more ports of a device via one or more of the connectors 435-1 and 435-2. As mentioned, a port may be a power port. As an example, the ports 470-1 to 470-N may include at least one power port (e.g., with an appropriate shape and size for a power connector).

The docking component 400 can include various circuitry 440, which may include communication circuitry 441, power circuitry 442, processor circuitry 443 and/or one or more other types of circuitry 444. When operatively coupled to a device such as the device 100 of FIG. 1, one or more types of the circuitry 440 of the docking component 400 may be utilized by the device 100 (e.g., for execution of one or more applications, charging, etc.). As an example, the power circuitry 442 can be or include one or more batteries, which may include one or more rechargeable batteries (e.g., one or more lithium-ion batteries, etc.). As an example, the docking component 400 can include antenna circuitry (e.g., as the other circuitry 444, etc.). For example, consider an antenna that may be for a particular type of wireless communication and/or wireless charging. As an example, an antenna may be a powered antenna that may help to increase reception and/or transmission of one or more wireless signals as associated with wireless communication circuitry of the docking component 400 and/or the device 100. As an example, the docking component 400 may include one or more SIM slots (e.g., as the other circuitry 444, etc.) that can receive one or more respective SIM cards. In such an example, the docking component 400 may include one or more antennas that are operatively coupled to the one or more SIM slots.

Figure 6:
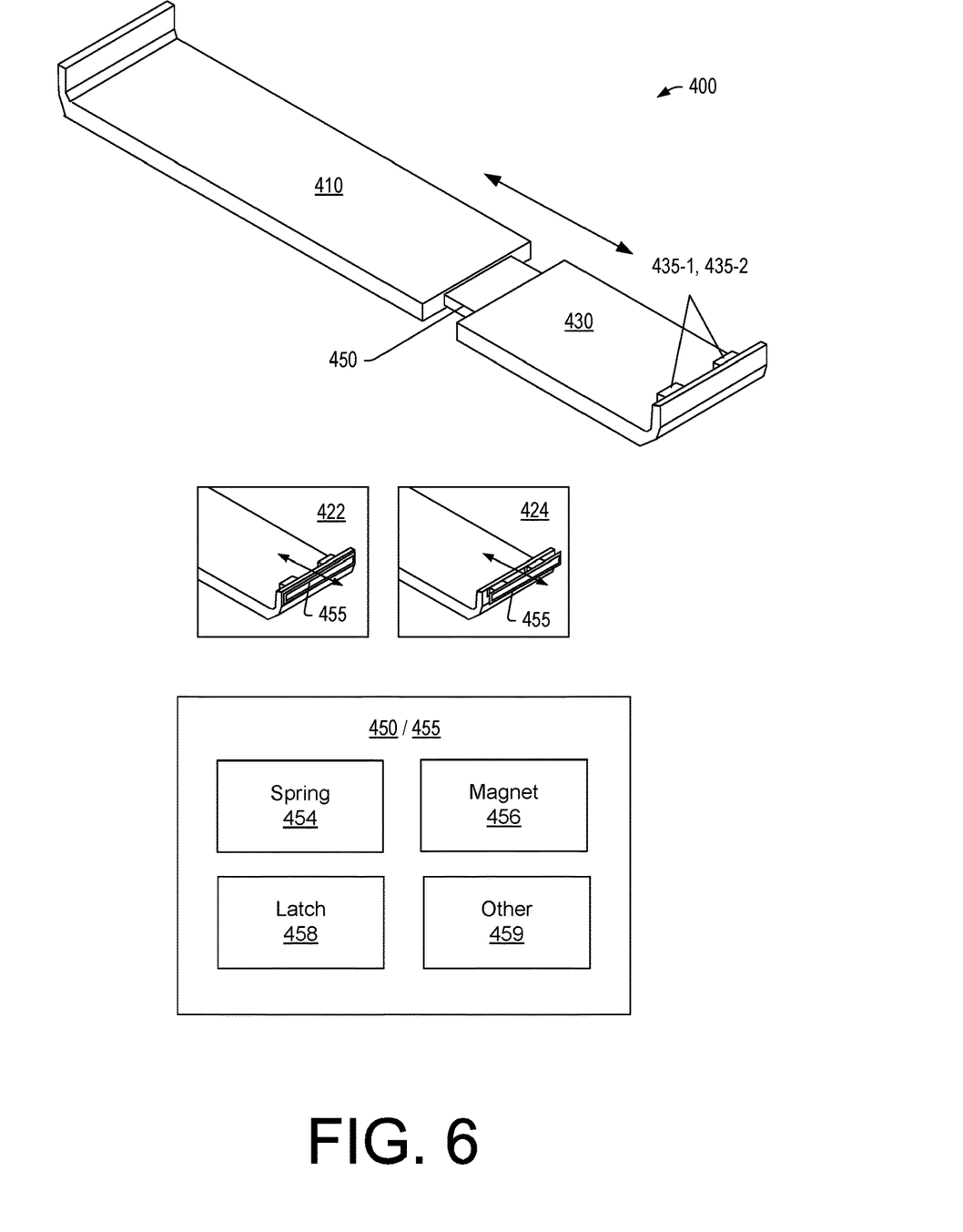
FIG. 6 is a diagram of an example of a docking component.

FIG. 6 shows some examples of translations mechanisms 450 and/or 455, which may be utilized for translating portions of the docking component 400. As mentioned, a translation mechanism may be with respect to a body portion (e.g., the translation mechanism 450 with respect to portion 410 or 430) or a translation mechanism may be with respect to a connector portion such as a portion of the one or more connectors 435-1 and 435-2 (e.g., the translation mechanism 455 via a push button, etc.).

In the example of FIG. 6, the one or more connectors 435-1 and 435-2 can be fixed and move with the portion 430 of the docking component 400. Or, for example, the connectors 435-1 and 435-2 may be translatable with respect to the docking component 400.

As shown, the translation mechanisms 450 and/or 455 can include one or more of a spring 454, a magnet 456, a latch 458 and one or more other translation parts. As to a spring, consider a spring that biases the portions 410 and 430 toward each other to be in a locked state and where upon translation of the ends 401 and 403 away from each other the spring behaves according to Hooke's law where force F increases as the distance along an x-axis increases according to a spring constant k (e.g., $F=k\Delta x$). As to a magnet, a magnetic force that acts to maintain the portions 410 and 430 in a locked state where the magnetic force is suitable for an individual to pull the ends 401 and 403 away from each other a distance sufficient to allow for fitting the docking component 400 with respect to a device (e.g., a distance of a length of a male connector as shown with respect to the plug 200 of FIG. 2, etc.). As to a latch, for example, a surface of the docking component 400 can include a translatable latch part that can be translated by a user's hand and then moved into a latched position and, as desired, moved into an unlatched position. For example, consider an underside of the docking component 400 as including a latch part that may be moved by a finger (e.g., optionally with a fingernail as including a fingernail groove or grooves).

As an example, one or more translation mechanisms may be utilized for transitioning a docking component between a locked state and an unlocked state.

FIG. 7 shows examples of the device 100 with respect to the docking component 400. In one set of examples, the docking component 400 is fit with respect to an underside of the keyboard housing 120 of the device 100 while in another set of examples, the docking component 400 is fit with respect to a keyboard side of the keyboard housing 120 of the device 100. As illustrated, the arrangement of features of the docking component 400 allow it to be fit in either of the two orientations shown, which allow for the device 100 to be oriented in one or more of the orientations shown.

FIG. 7 also shows the docking component 400 as optionally including one or more feet 491-1 and 491-2. The one or more feet 491-1 and 491-2 may help to angle the device 100 when it is seated on a surface such as a table or a desk. For example, the one or more feet 491-1 and 491-2 may angle the display 182 of the display housing 180 for better viewing by a user and/or the one or more feet 491-1 and 491-2 may angle the keyboard housing 120 for better ergonomics of touch typing when the device 100 is in a laptop orientation. As an example, the cross-member 405 of the docking component 400 may be wedge shaped to provide for angling of a device in one or more orientations. As an example, a wedge shape may be achieved via a cross-sectional profile of the cross-member 405 and/or via one or more feet of the cross-member 405.

As mentioned, the docking component 400 can include one or more passages in the cross-member 405. FIG. 7 illustrates an example of a passage 413, which may align with a feature of the device 100 (e.g., the pointing stick 144, etc.).

As an example, a keyboard housing may be relatively thin, for example, consider a keyboard housing that is approximately 10 mm thick or less (e.g., consider about 5 mm thick). Such a thickness may allow for one or more Type C USB ports to be positioned on one side or, for example, on both sides. As an example, a docking component can be symmetric to an extent that one or more connectors of the docking component can be fit into respective, corresponding ports of a device with the docking component in one of two locked orientations, for example, as illustrated in the examples of FIG. 7.

As an example, a Type C USB specification may be adhered to for one or more ports and corresponding one or more connectors. Such ports and connectors can be, by specification, reversible. As an example, a docking component can include dock features (e.g., external power, WIFI card slot, extra ports, external battery, etc.) that can be operatively coupled to a device via one or more reversibly specified ports/connectors in one of two orientations. As an example, a docking component may be a clamp that can clamp to sides of a device (e.g., opposing sides such as a left hand side and a right hand side). As an example, a device may be a "convertible" device in that it can be oriented in a laptop orientation (e.g., a laptop mode) and in a tablet orientation (e.g., a tablet mode).

As an example, a docking component can utilize a plurality of ports of a device to increase one or more of bandwidth, physical stability (e.g., as the ports can function to couple the docking component to the device), and power. As an example, one port may be utilized for power while another port is utilized for information.

As an example, a depth of a docking component may be less than the depth of a keyboard of a keyboard housing of a device. For example, in FIG. 7, the docking component 400 does not fully cover the keyboard as keys are visible. As an example, a distance between ports as located on a side of a device may cover a depth of approximately at least one depth of a key of a keyboard of the device. For example, in FIG. 7, the depth of the docking component is approximately two to three keys. Referring again to FIG. 1, the one or more ports 135-1 and 135-2 are illustrated as being between about two to three keys in depth from end to end (e.g., a depth span of a plurality of ports). As an example, where the span between female ports increases, the physical stability of a docking component that includes male connectors that can be received by the female ports may increase. Such an approach may help to hinder tilting, rocking, etc., of the docking component with respect to the device.

As an example, a side of a docking component may be hooked over a keyboard housing of a device, for example, via one or more of pins, holes, etc., that may align. Such features may be existing features of a device such that the device does not need modification to cooperate with features of the docking component.

As an example, one or more sides of a docking component may include one or more passages such as, for example, one or more openings for purposes of accessing a port, passing air, etc.

As an example, a docking component can include a spring driven sliding action mechanism to hold it onto a device, where such a mechanism allows it to be easily removed by a user.

As an example, a docking component may be used in one or more of a laptop, a stand or a tent mode in one orientation and in a tent, a stand, or a tablet mode in another orientation.

As shown with respect to FIG. 7, a docking component can be reversed about the axis of its connectors (e.g., TYPE-C USB) so that it fits in various orientations.

As an example, a device may include one or more drivers that can be utilized to operatively couple circuitry of a docking component to circuitry of the device. For example, a driver may be executable by a processor of a device such that circuitry of a docking component is recognized and available for utilization for various operations of the device. As an example, a docking component may include one or more features of a THINKPAD® USB 3.0 docking component. As an example, a docking component may operate via "plug-n-play" where one or more drivers are involved. As an example, a docking component may provide for use of one or more external monitors, Ethernet, headphones/speakers, USB printers and scanners, keyboard, mouse, access to external storage, etc. As an example, support may be provided for USB to DVI/VGA, USB to HDMI, USB to Display Port, etc. As an example, a docking component can include an associated power cord with a plug that can be utilized with an AC and/or DC power source.

As an example, a docking component can include a cross-member that includes a first end, an opposing second end, circuitry and at least one port operatively coupled to the circuitry; a first end wall at the first end of the cross-member; a second end wall at the second end of the cross-member, where the second end wall includes at least one connector that is operatively coupled to the circuitry; and a translation mechanism that translates the at least one connector from an unlocked state to a locked state that engages the at least one connector and a corresponding at least one connector of an information handling device. In such an example, the at least one port can be a power port, which may provide for transmission of power or power and information.

As an example, at least one connector of an end wall of a docking component can be at least one male connector and at least one connector of an information handling device can be at least one female connector. In such an example, the connectors can couple in the locked state.

As an example, a docking component can include an end wall that includes at least two connectors. As an example, a docking component can include a cross-member that includes a plurality of ports.

As an example, a cross-member of a docking component can include a first portion and a second portion where a translation mechanism translates at least one connector of an end wall of the docking component via translation of the first and second portions with respect to each other. In such an example, opposing end walls of respective portions of the docking component can be brought closer to each other to snugly fit sides of a device. In such an example, one end wall can include at least one connector male connector that is fixed to its respective portion. As an example, a translation mechanism of a docking component may translate at least one connector with respect to an end wall.

As an example, a docking component can include at least one connector that is a reversible connector. As an example, a docking component can include one connector where that single connector is a reversible connector. As an example, a docking component can include two connectors where each of the two connectors is a reversible connector. As an example, where a side wall of a docking component includes multiple connectors, connection of the multiple connectors with corresponding connectors of a device can limit rotation of the docking component with respect to the device. For example, consider two male connectors of a side wall of a docking component that connect to two female connectors of a device (e.g., a keyboard housing of an information handling device) such that the docking component is limited in rotation (e.g., rocking) and more stability secured to the device via friction of multiple mating connectors.

As an example, a connector can be a TYPE-C USB connector. As an example, a docking component can include one connector where that one connector is a TYPE-C USB connector. As an example, a docking component can include two connectors where each of the two connectors is a TYPE-C USB connector. As mentioned, TYPE-C USB connectors are reversible. As an example, a docking component can be "reversible" where it includes one or more reversible connectors. In such an example, the docking component may be flipped 180 degrees and still coupled to a device that includes a corresponding number of reversible connectors available for mating with those of the docking component. For example, consider one to one mating or, for example, two to two mating (e.g., on one side or opposing sides).

As an example, a docking component can include at least one port that includes at least one information port, that is at least one power port or that is one power and information port.

As an example, a docking component of claim 1 can include at least one battery. As an example, a docking component can include at least one antenna.

As an example, a system can include an information handling device that includes a processor, memory accessible to the processor, a keyboard housing, a display housing, a hinge assembly that operatively couples the keyboard housing and the display housing, a first side and a second side, where the second side includes at least one connector; and a docking component that includes a cross-member that includes a first end, an opposing second end, circuitry and at least one port operatively coupled to the circuitry, a first end wall at the first end of the cross-member, a second end wall at the second end of the cross-member, where the second end wall includes at least one connector that is operatively coupled to the circuitry, and a translation mechanism that translates the at least one connector from an unlocked state to a locked state that engages the at least one connector and a corresponding at least one connector of the information handling device. In such an example, the system can include a first orientation and a second orientation of the docking component with respect to the information handling device, where in each of the first and second orientations, in the locked state, the at least one connector is engaged with the corresponding at least one connector of the information handling device. In such an example, the keyboard housing can include a keyboard where, in the first orientation, the cross-member covers at least a portion of the keyboard and where the keyboard housing includes a bottom side where, in the second orientation, the cross-member covers at least a portion of the bottom side.

As an example, in the locked state, a first end wall of a docking component can engage a first side of an information handling device and a second end wall of the docking component can engage a second side of the information handling device where at least one of the end walls includes at least one connector that engages at least one connector of at least one of the sides.

As an example, an information handling device can include a closed clamshell orientation (e.g., 0 degrees) and a tablet orientation (e.g., 360 degrees). Such a device may include a tent orientation and, for example, a flat orientation (e.g., 180 degrees). As an example, in a closed clamshell orientation and a locked state, a docking component can be in a first orientation with respect to a keyboard housing and, in a tablet orientation and the locked state, the docking component can be in a second, different orientation with respect to the keyboard housing.

As an example, a method can include securing a docking component to an information handling device in one of two different orientations where at least one connector of the docking component is engaged with at least one corresponding connector of the information handling device; and transmitting at least one of information and power between the docking component and the information handling device. In such an example, the information handling device can include a closed clamshell orientation and a tablet orientation, where, in the closed clamshell orientation, the docking component is in a first of the two different orientations and where, in the tablet orientation, the docking component is in a second of the two different orientations.

As described herein, various acts, steps, etc., may be implemented as instructions stored in one or more computer-readable storage media. For example, one or more computer-readable storage media can include computer-executable (e.g., processor-executable) instructions to instruct a device. A computer-readable medium may be a computer-readable medium that is not a carrier wave.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components (physical components) programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory chip, a memory card, a storage disk, etc.) and referred to as a computer-readable storage medium.

Figure 8:
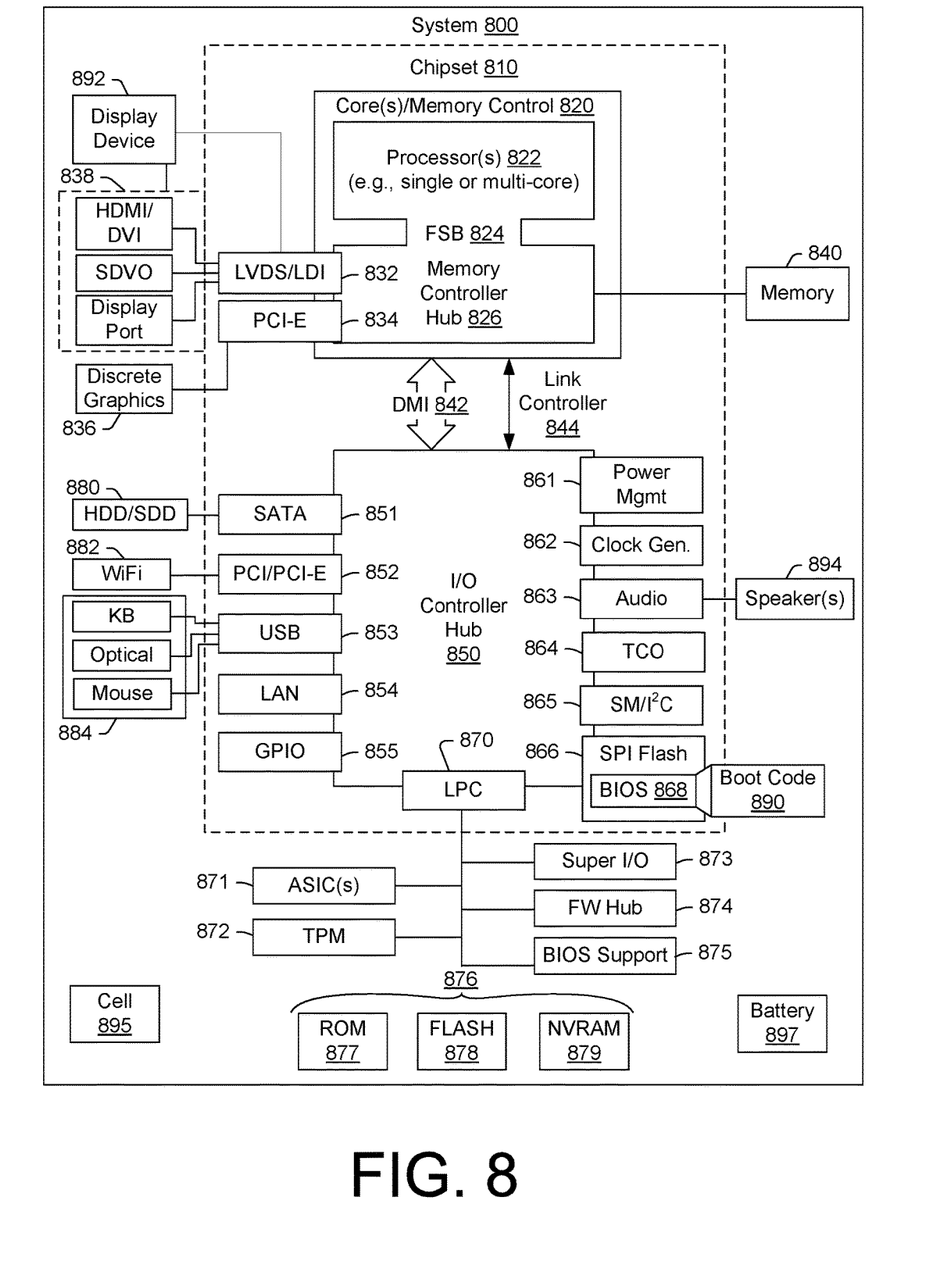
FIG. 8 is a diagram of an example of a system.

While various examples of circuits or circuitry have been discussed, FIG. 8 depicts a block diagram of an illustrative computer system 800. The system 800 may be, as an example, a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a satellite, a base, a server or other machine may include other features or only some of the features of the system 800. As an example, a device such as the device 100 of FIG. 1 may include at least some of the features of the system 800. As an example, the docking component 400 may include one or more features of the system 800.

As shown in FIG. 8, the system 800 includes a so-called chipset 810. A chipset refers to a group of integrated circuits, or chips, that are designed (e.g., configured) to work together. Chipsets are usually marketed as a single product (e.g., consider chipsets marketed under the brands INTEL®, AMD®, etc.).

In the example of FIG. 8, the chipset 810 has a particular architecture, which may vary to some extent depending on brand or manufacturer. The architecture of the chipset 810 includes a core and memory control group 820 and an I/O controller hub 850 that exchange information (e.g., data, signals, commands, etc.) via, for example, a direct management interface or direct media interface (DMI) 842 or a link controller 844. In the example of FIG. 8, the DMI 842 is a chip-to-chip interface (sometimes referred to as being a link between a "northbridge" and a "southbridge").

The core and memory control group 820 include one or more processors 822 (e.g., single core or multi-core) and a memory controller hub 826 that exchange information via a front side bus (FSB) 824. As described herein, various components of the core and memory control group 820 may be integrated onto a single processor die, for example, to make a chip that supplants the conventional "northbridge" style architecture.

The memory controller hub 826 interfaces with memory 840. For example, the memory controller hub 826 may provide support for DDR SDRAM memory (e.g., DDR, DDR2, DDR3, etc.). In general, the memory 840 is a type of random-access memory (RAM). It is often referred to as "system memory".

The memory controller hub 826 further includes a low-voltage differential signaling interface (LVDS) 832. The LVDS 832 may be a so-called LVDS Display Interface (LDI) for support of a display device 892 (e.g., a CRT, a flat panel, a projector, etc.). A block 838 includes some examples of technologies that may be supported via the LVDS interface 832 (e.g., serial digital video, HDMI/DVI, display port). The memory controller hub 826 also includes one or more PCI-express interfaces (PCI-E) 834, for example, for support of discrete graphics 836. Discrete graphics using a PCI-E interface has become an alternative approach to an accelerated graphics port (AGP). For example, the memory controller hub 826 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 850 includes a variety of interfaces. The example of FIG. 8 includes a SATA interface 851, one or more PCI-E interfaces 852 (optionally one or more legacy PCI interfaces), one or more USB interfaces 853, a LAN interface 854 (more generally a network interface), a general purpose I/O interface (GPIO) 855, a low-pin count (LPC) interface 870, a power management interface 861, a clock generator interface 862, an audio interface 863 (e.g., for speakers 894), a total cost of operation (TCO) interface 864, a system management bus interface (e.g., a multi-master serial computer bus interface) 865, and a serial peripheral flash memory/controller interface (SPI Flash) 866, which, in the example of FIG. 8, includes BIOS 868 and boot code 890. With respect to network connections, the I/O hub controller 850 may include integrated gigabit Ethernet controller lines multiplexed with a PCI-E interface port. Other network features may operate independent of a PCI-E interface.

The interfaces of the I/O hub controller 850 provide for communication with various devices, networks, etc. For example, the SATA interface 851 provides for reading, writing or reading and writing information on one or more drives 880 such as HDDs, SDDs or a combination thereof. The I/O hub controller 850 may also include an advanced host controller interface (AHCI) to support one or more drives 880. The PCI-E interface 852 allows for wireless connections 882 to devices, networks, etc. The USB interface 853 provides for input devices 884 such as keyboards (KB), one or more optical sensors, mice and various other devices (e.g., microphones, cameras, phones, storage, media players, etc.). On or more other types of sensors may optionally rely on the USB interface 853 or another interface (e.g., I$^2$C, etc.). As to microphones, the system 800 of FIG. 8 may include hardware (e.g., audio card) appropriately configured for receipt of sound (e.g., user voice, ambient sound, etc.).

In the example of FIG. 8, the LPC interface 870 provides for use of one or more ASICs 871, a trusted platform module (TPM) 872, a super I/O 873, a firmware hub 874, BIOS support 875 as well as various types of memory 876 such as ROM 877, Flash 878, and non-volatile RAM (NVRAM) 879. With respect to the TPM 872, this module may be in the form of a chip that can be used to authenticate software and hardware devices. For example, a TPM may be capable of performing platform authentication and may be used to verify that a system seeking access is the expected system.

The system 800, upon power on, may be configured to execute boot code 890 for the BIOS 868, as stored within the SPI Flash 866, and thereafter processes data under the control of one or more operating systems and application software (e.g., stored in system memory 840). An operating system may be stored in any of a variety of locations and accessed, for example, according to instructions of the BIOS 868. Again, as described herein, a satellite, a base, a server or other machine may include fewer or more features than shown in the system 800 of FIG. 8. Further, the system 800 of FIG. 8 is shown as optionally include cell phone circuitry 895, which may include GSM, CDMA, etc., types of circuitry configured for coordinated operation with one or more of the other features of the system 800. Also shown in FIG. 8 is battery circuitry 897, which may provide one or more battery, power, etc., associated features (e.g., optionally to instruct one or more other components of the system 800). As an example, a SMBus may be operable via a LPC (see, e.g., the LPC interface 870), via an I$^2$C interface (see, e.g., the SM/I$^2$C interface 865), etc.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:
1. A docking component comprising:
 a cross-member that comprises a first end, an opposing second end, a x,y-planar surface that extends between the first end and the second end, circuitry and at least one port operatively coupled to the circuitry;

a first end wall at the first end of the cross-member, wherein the first end wall extends outwardly in a z-direction from the x,y-planar surface;

a second end wall at the second end of the cross-member, wherein the second end wall extends outwardly in the z-direction from the x,y-planar surface, wherein the second end wall comprises at least two connectors that are operatively coupled to the circuitry, and wherein each of the at least two connectors is a male, reversible power and information connector; and a translation mechanism that translates the at least two connectors from an unlocked state to a locked state that engages the at least two connectors and a corresponding at least two female connectors of an information handling device for each of a plurality of locked state orientations of the docking component with respect to the information handling device, wherein the x,y-planar surface faces the information handling device.

2. The docking component of claim 1 wherein the cross-member comprises a plurality of ports.

3. The docking component of claim 1 wherein the cross-member comprises a first portion and a second portion and wherein the translation mechanism translates the at least two connectors via translation of the first and second portions with respect to each other.

4. The docking component of claim 3 wherein the at least two connectors are fixed to one of the first portion and the second portion.

5. The docking component of claim 1 wherein the translation mechanism translates the at least two connectors with respect to the second end wall.

6. The docking component of claim 1 wherein the at least two connectors comprise at least one TYPE-C USB connector.

7. The docking component of claim 1 wherein the at least one port comprises at least one information port.

8. The docking component of claim 1 wherein the at least one port comprises at least one port that is a power and information port.

9. The docking component of claim 1 comprising at least one battery.

10. The docking component of claim 1 comprising at least one antenna.

11. The docking component of claim 1 wherein the first end wall does not comprise a male power connector, a male information connector or a male power and information connector that engages a corresponding female connector of the information handling device.

12. A system comprising:

an information handling device that comprises a processor, memory accessible to the processor, a keyboard housing, a display housing, a hinge assembly that operatively couples the keyboard housing and the display housing, a first side and a second side, wherein the second side comprises at least one connector;

a docking component that comprises a cross-member that comprises a first end, an opposing second end, circuitry and at least one port operatively coupled to the circuitry, a first end wall at the first end of the cross-member, a second end wall at the second end of the cross-member, wherein the second end wall comprises at least one connector that is operatively coupled to the circuitry, and a translation mechanism that translates the at least one connector from an unlocked state to a locked state that engages the at least one connector and a corresponding at least one connector of the information handling device; and a first orientation and a second orientation of the docking component with respect to the information handling device, wherein in each of the first and second orientations, in the locked state, the at least one connector is engaged with the corresponding at least one connector of the information handling device, wherein the keyboard housing comprises a keyboard and wherein, in the first orientation, the cross-member covers at least a portion of the keyboard and wherein the keyboard housing comprises a bottom side and wherein, in the second orientation, the cross-member covers at least a portion of the bottom side.

13. The system of claim 12 wherein, in the locked state, the first end wall engages the first side of the information handling device.

14. The system of claim 12 wherein the first orientation is a tablet orientation.

15. A method comprising:

securing a docking component to an information handling device in one of two different orientations wherein at least one connector of the docking component is engaged with at least one corresponding connector of the information handling device; and transmitting at least one of information and power between the docking component and the information handling device, wherein the information handling device comprises a closed clamshell orientation and a tablet orientation, wherein, in the closed clamshell orientation, the docking component is in a first of the two different orientations and wherein, in the tablet orientation, the docking component is in a second of the two different orientations.

* * * * *